US010976786B2

(12) United States Patent
Wang

(10) Patent No.: US 10,976,786 B2
(45) Date of Patent: Apr. 13, 2021

(54) REMOVABLE ELECTRONIC DEVICE CONFIGURED FOR ONE-HAND OPERATIONS

(71) Applicant: NANNING FUGUI PRECISION INDUSTRIAL CO., LTD., Nanning (CN)

(72) Inventor: Wei Wang, Shenzhen (CN)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 16/804,299

(22) Filed: Feb. 28, 2020

(65) Prior Publication Data

US 2020/0293096 A1 Sep. 17, 2020

(30) Foreign Application Priority Data

Mar. 14, 2019 (CN) ......................... 201910195373.1

(51) Int. Cl.
*G06F 1/18* (2006.01)
*H05K 5/02* (2006.01)

(52) U.S. Cl.
CPC ........... *G06F 1/187* (2013.01); *H05K 5/0221* (2013.01)

(58) Field of Classification Search
CPC ......... G06F 1/187; H05K 5/0221; H05K 7/14
See application file for complete search history.

(56) References Cited

U.S. PATENT DOCUMENTS

| | | | | |
|---|---|---|---|---|
| 7,580,253 | B1 | 8/2009 | Chen et al. | |
| 7,835,148 | B2 * | 11/2010 | Tu | G06F 1/187 361/679.39 |
| 8,644,034 | B2 * | 2/2014 | Zheng | G06F 1/181 361/816 |
| 9,058,151 | B2 * | 6/2015 | Chou | G06F 1/187 |
| 9,558,789 | B1 * | 1/2017 | Van Pelt | G11B 33/127 |
| 2007/0205702 | A1 * | 9/2007 | Hsu | G11B 33/12 312/9.1 |
| 2010/0309621 | A1 * | 12/2010 | Chang | G11B 33/124 361/679.39 |

(Continued)

FOREIGN PATENT DOCUMENTS

| | | |
|---|---|---|
| CN | 1412772 A | 4/2003 |
| CN | 200959104 | 10/2007 |

(Continued)

*Primary Examiner* — Hung S. Bui
*Assistant Examiner* — Sagar Shrestha
(74) *Attorney, Agent, or Firm* — ScienBiziP, P.C.

(57) ABSTRACT

An electronic device which can be installed and removed in an apparatus using only one hand includes a base and a positioning member. A positioning opening is formed on a first side surface of the base, and a channel is formed in the base with one end connected to the positioning opening. The positioning member is located in the channel and has a holding groove exposed from a front surface of the base. The positioning member is movable along the channel between a released position and a compressed (mounted) position. In the released position, a locking portion of the positioning member extends out of the channel via the positioning opening, in the compressed position the locking portion is retracted into the channel.

11 Claims, 5 Drawing Sheets

5 24 22 21 23 2 3 25 246 4 4 4

(56) References Cited

U.S. PATENT DOCUMENTS

| | | | | |
|---|---|---|---|---|
| 2010/0321879 | A1* | 12/2010 | Peng | G06F 1/187 361/679.33 |
| 2011/0001031 | A1* | 1/2011 | Peng | G06F 1/187 248/316.7 |
| 2011/0101831 | A1* | 5/2011 | Wang | G11B 33/124 312/223.1 |
| 2011/0182026 | A1* | 7/2011 | Kang | G11B 33/128 361/679.37 |
| 2012/0213577 | A1* | 8/2012 | Fan | G06F 1/187 403/327 |
| 2013/0099640 | A1* | 4/2013 | Hu | G06F 1/187 312/223.2 |
| 2018/0132364 | A1* | 5/2018 | Apter | F16B 2/18 |

FOREIGN PATENT DOCUMENTS

| | | | |
|---|---|---|---|
| CN | 101937700 | A | 1/2011 |
| CN | 106919231 | A | 7/2017 |
| TW | M321572 | U | 11/2007 |
| TW | I527027 | B | 3/2016 |

* cited by examiner

REMOVABLE ELECTRONIC DEVICE CONFIGURED FOR ONE-HAND OPERATIONS

FIELD

The present is relative to removable electronic devices.

BACKGROUND

Removable devices, such as removable power supplies, removable hard disks, and removable fans, are widely used. The removable devices provide sufficient and continuous power, or sufficient and easy-to-manage data storage space. A user can perform replacement and online maintenance more easily when the devices are removable.

To properly lock a removable hard disk, a latch structure is often provided on the casing for the removable hard disk to be mounted thereon to prevent the removable hard disk from sliding out of the casing. A user may need to use both hands to remove and replace such a device.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
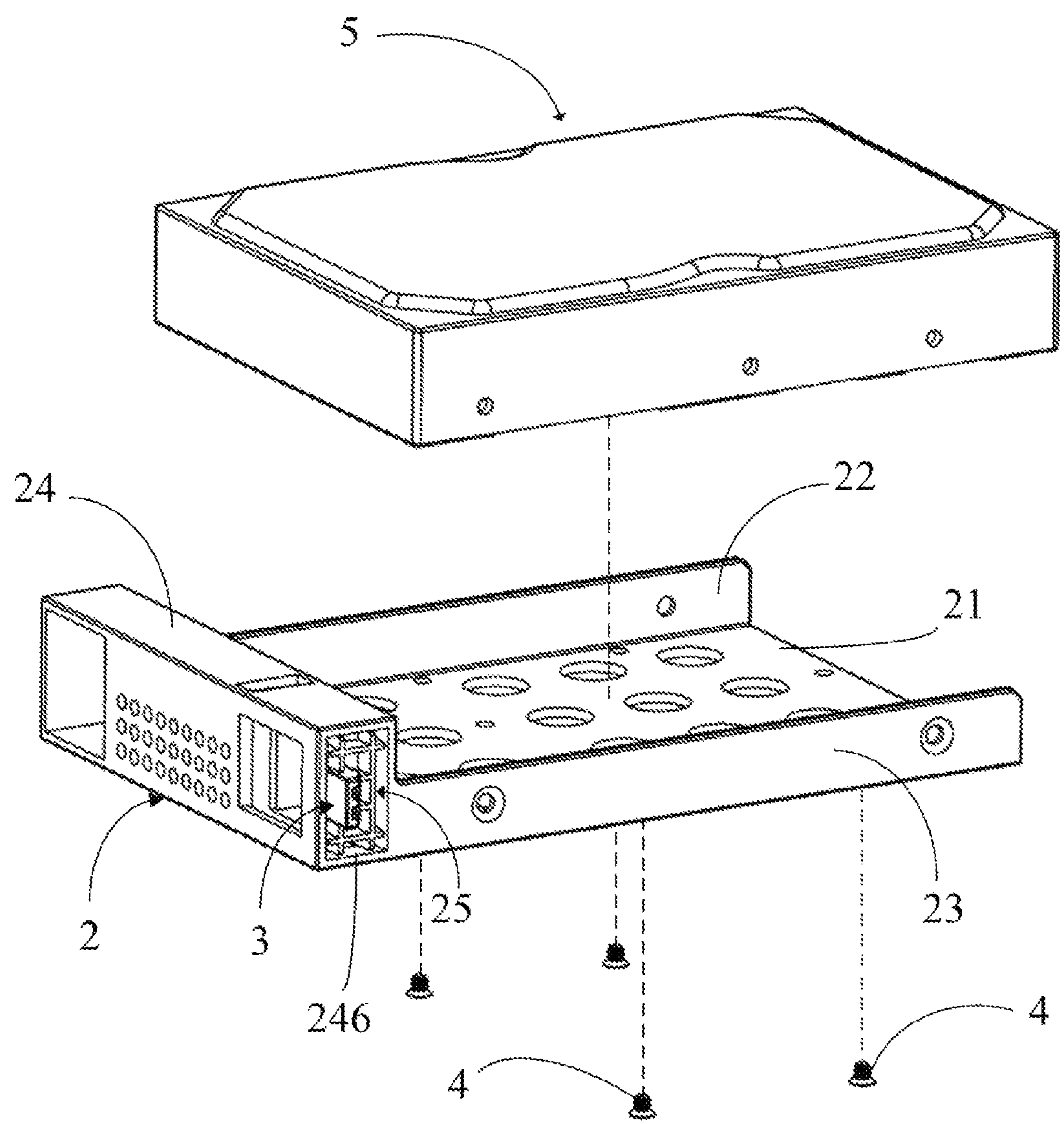
FIG. 1 is a structural exploded view of a removable device in accordance with embodiments of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements.

It should be noted that references to "an" or "one" embodiment in this disclosure are not necessarily to the same embodiment, and such references mean "at least one."

The term "connected" is defined as directly or indirectly through intervening components. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 is a structural exploded view of a removable device (removable device 1) in accordance with some embodiments of the present disclosure. In one embodiment, the removable device 1 includes a base 2, a positioning member 3, fastening elements 4, and an electronic device 5. In the embodiment of FIG. 1, the electronic device 5 may be a data storage hard drive, but it is not limited thereto. In other embodiments, the electronic device 5 may be a power supply or a fan.

In one embodiment, the base 2 includes a bottom plate 21, two side plates 22 and 23, and a housing 24. The side plates 22 and 23 are respectively disposed on opposite sides of the bottom plate 21. The housing 24 is connected to the edges of the bottom plate 21 and the side plates 22 and 23. Moreover, the housing 24, the bottom plate 21, and the side plates 22 and 23 form a receiving space, and the electronic device 5 can be disposed in the receiving space. In one embodiment, the electronic device 5 is affixed to the base 2 by the fastening elements 4 (such as screws).

Figure 2:
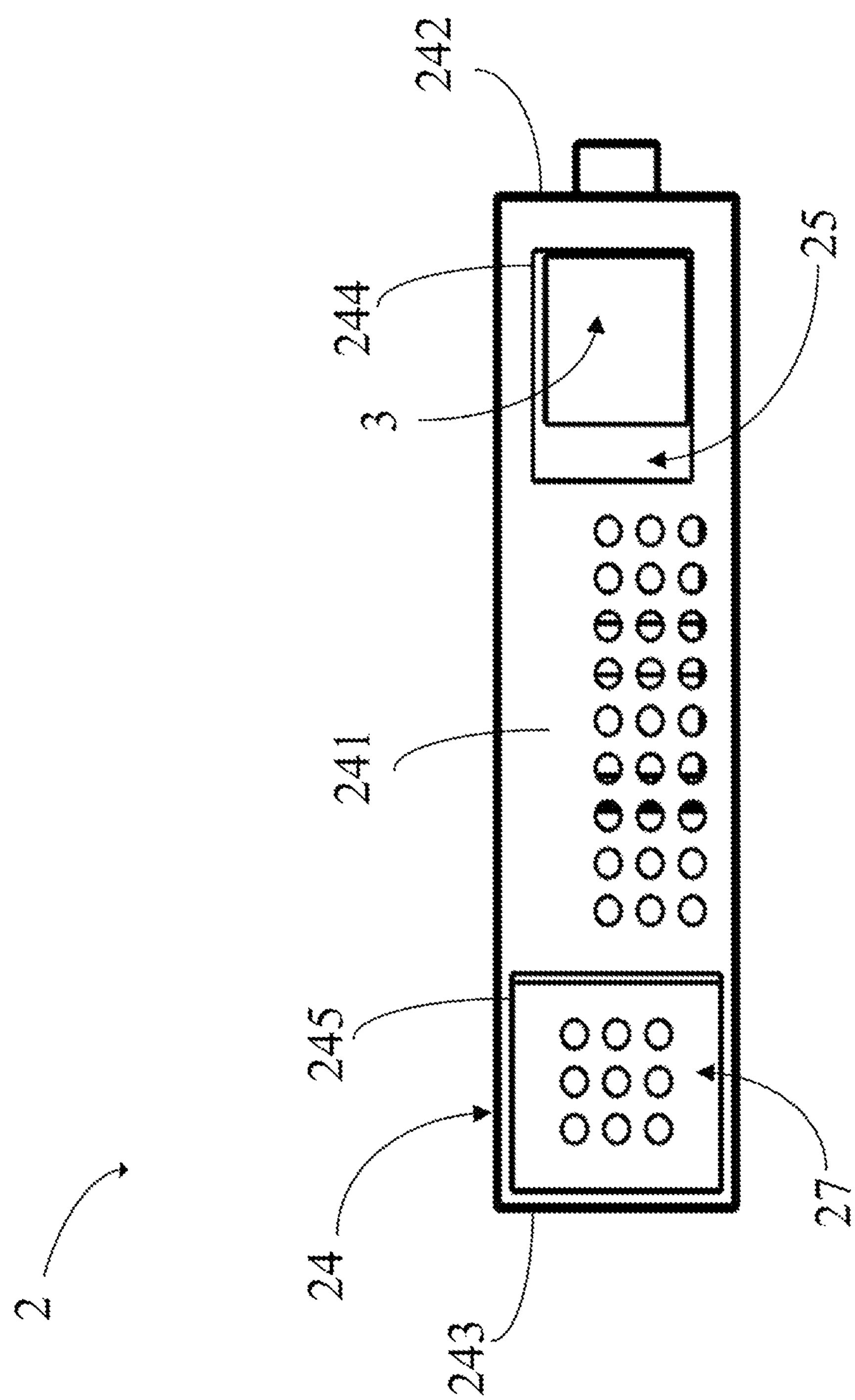
FIG. 2 is a front view of the removable device in accordance with embodiments of the present disclosure.

FIG. 2 is a front view of the base 2 and the positioning member 3. In one embodiment, the housing 24 is disposed on the side of the removable device 1 facing the user, and configured to receive the positioning member 3. In one embodiment, the housing 24 has a front surface 241, a first side surface 242, and a second side surface 243. The front surface 241 is connected to and between the first side surface 242 and the second side surface 243. A first opening 244 and a second opening 245 are formed on the front surface 241 of the housing 24. The first opening 244 is adjacent to the first side surface 242, and the second opening 245 is adjacent to the second side surface 243. A second holding groove 27 is formed on the front surface 241 of the housing 24, and located inside of the housing 24. The second holding groove 27 is between the channel 25 and the second side surface 243. In an embodiment, the base 2 does not include the second holding groove 27.

Figure 3:
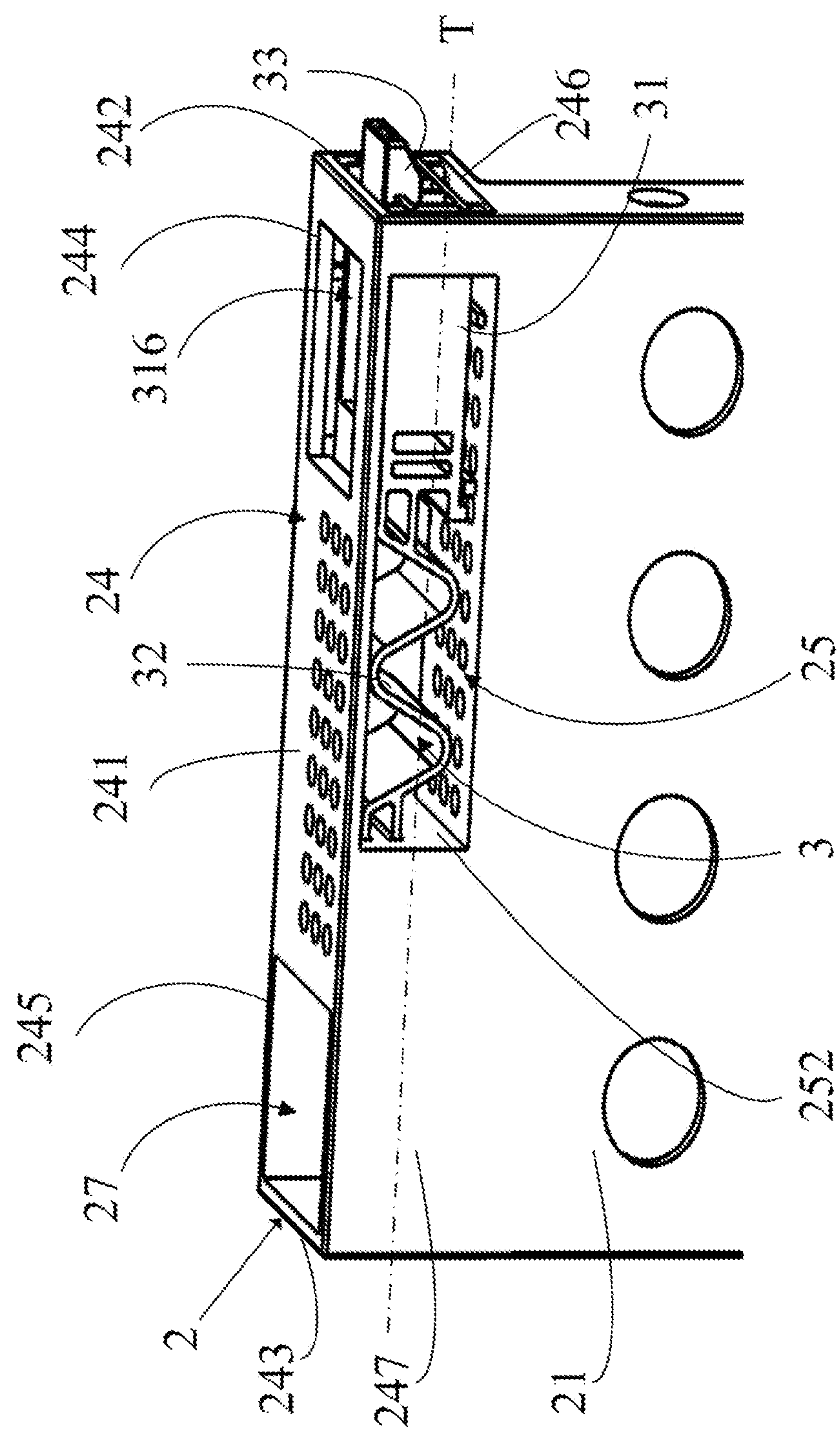
FIG. 3 is a schematic view of the removable device in accordance with embodiments of the present disclosure, wherein the positioning member is in a released position.

FIG. 3 is a schematic view of the base 2 and the positioning member 3. In one embodiment, a channel 25 extends in the housing 24 along an imaginary transverse axis T. The imaginary transverse axis T passes through the first side surface 242 and the second side surface 243, and is parallel to the front surface 241. Moreover, a positioning opening 246 is formed on the first side surface 242 of the housing 24. One end of the channel 25 is in communication with the positioning opening 246, and the channel 25 communicates with the first opening 244. The channel 25 extends from the positioning opening 246 to the surface 252. In one embodiment, the width of the channel 25 is constant.

Figure 4:
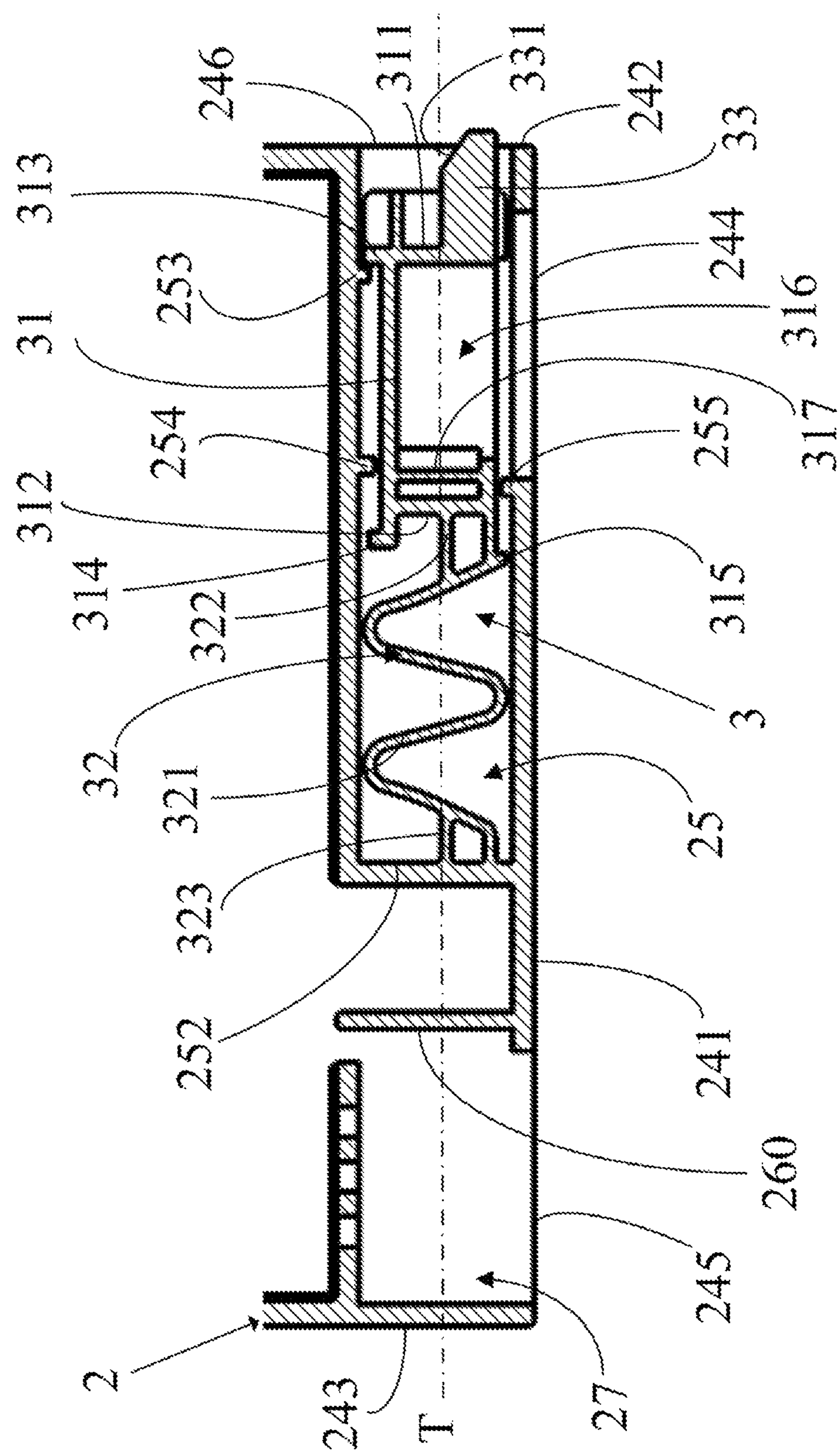
FIG. 4 is a cross-sectional view of the removable device in accordance with embodiments of the present disclosure, wherein the positioning member is in a compressed position.

FIG. 4 is a cross-sectional view of the base 2 and the positioning member 3. In one embodiment, the positioning member 3 is disposed in the channel 25, and includes a body 31, an elastic structure 32, and a locking portion 33. The body 31 extends from the first end 311 to the second end 312 along the imaginary transverse axis T. A first holding groove 316 is formed on the side of the body 31 facing the front surface 241, and the first holding groove 316 is exposed from the front surface 241 via the first opening 244. The first holding groove 316 includes a first holding surface 317, and the second holding groove 27 includes a second holding surface 270. The first holding surface 317 and the second holding surface 270 face opposite directions, and the imaginary transverse axis T passes through the first holding surface 317 and the second holding surface 270. In one embodiment, the first holding surface 317 and the second holding surface 270 are perpendicular to the imaginary transverse axis T.

In one embodiment, the elastic structure 32 includes a wave-shaped compressing portion 321, and two end portions, 322 and 323. The end portions 322 and 323 are respectively connected to opposite sides of the compressing portion 321, wherein the end portion 322 is connected to the first end 311 of the body 31, and the end portion 323 is connected to the end surface 252 of the channel 25. In one embodiment, the end portions 322 and 323 are located on one side of the elastic structure 32 adjacent to the front surface 241, so as to stabilize the movement of the elastic structure 32.

The locking portion 33 is configured to be inserted into a locking groove of a casing of an apparatus (not shown in figures) so as to mount the removable device 1 to the casing of the apparatus. In one embodiment, the locking portion 33 is connected to the first end 311 of the body 31. The width of the locking portion 33 in a direction perpendicular to the imaginary transverse axis T is less than the width of the body 31 in the direction perpendicular to the imaginary transverse axis T. The locking portion 33 has an inclined plane 331 far from one side of the body 31, and the inclined plane 331 guides the locking portion 33 for insertion into the locking groove of the apparatus.

In one embodiment, a number of block structures, such as block structures 253, 254, and 255, are formed on the inner surface of the channel 25. A number of positioning structures, such as positioning structures 313, 314, and 315, are formed on the positioning member 3. The block structures 253, 254 and 255 and the positioning structures 313, 314 and 315 cooperate to limit the position of the positioning member 3 in the channel 25, so as to avoid damage to the positioning member 3 through improper use.

In particular, the block structures 253 and 254 protrude from the inner surface of the channel 25 facing the first opening 244. The block structure 253 is closer than the block structure 254 to the positioning opening 246. The block structure 255 is adjacent to the edge of the first opening 244, and protrudes from the inner surface of the channel 25 that is opposite to the front surface 241. The positioning structure 313 protrudes from the first end 311 of the body 31 in a direction that is perpendicular to the imaginary transverse axis T, and faces the block structure 253. The positioning structure 314 has an L-shaped section, and is connected to the first end 311 of the body 31. The portion of the positioning structure 314 which protrudes in the direction that is perpendicular to the imaginary transverse axis T faces the block structure 254. The positioning structure 315 protrudes from the junction of the compressing portion 321 and end portion 322 of the elastic structure 32 in a direction that is inclined relative to the imaginary transverse axis T, and faces the block structure 255.

In one embodiment, the distance between the positioning structure 314 and the block structure 254 is equal to the distance between the positioning structure 315 and the block structure 255. However, as shown in FIG. 4, since the distance between the positioning structure 315 and the second end 312 of the body 31 is greater than the distance between the positioning structure 314 and the second end 312 of the body 31, the block structure 254 is closer than the block structure 255 to the positioning opening 246.

Figure 5:
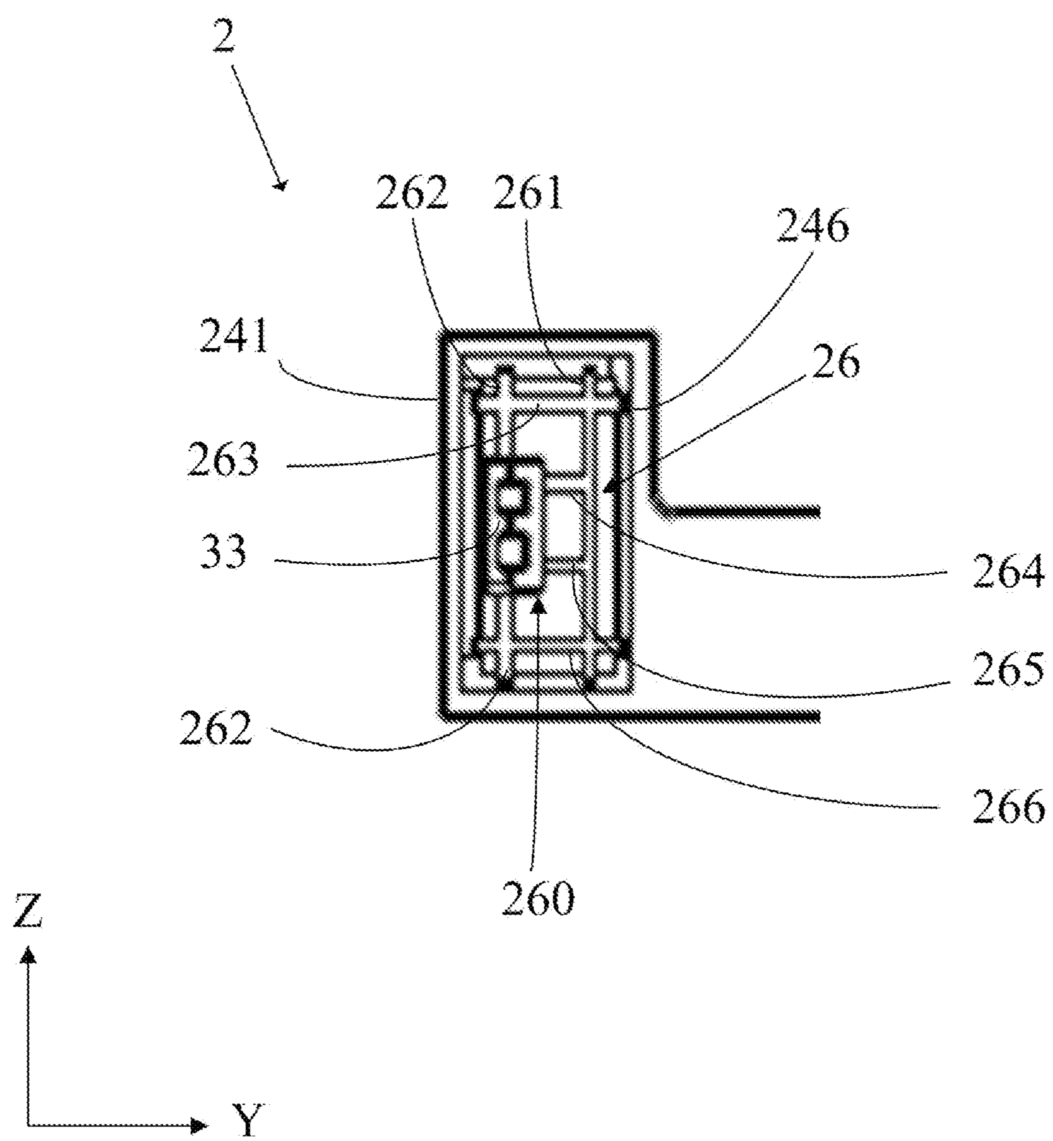
FIG. 5 is a side view of the removable device in accordance with embodiments of the present disclosure.

FIG. 5 is a side view of the base 2 and the positioning member 3. In one embodiment, the base 2 further includes a guide portion 26. The guide portion 26 is adjacent to the positioning opening 246, and has a guide channel 260 for the locking portion 33 to pass therethrough. In particular, the guide portion 26 includes the transverse ribs 263, 264, 265, and 266 arranged on the positioning opening 246 in a first direction (Z-axis direction). The length of the transverse rib 263 and transverse rib 266 is the same as the width of the positioning opening 246 in a second direction (Y-axis direction). The length of the transverse rib 264 and the transverse rib 265 is less than the length of the transverse rib 263 and the transverse rib 266. The ends of the transverse rib 264 and the transverse rib 265 define an upper boundary of the guide channel 260. The edge of the positioning opening 246 defines the lower boundary of the guide channel 260.

In addition, the guide portion 26 further includes a single longitudinal rib 261 and two longitudinal ribs 262. The longitudinal rib 261 is connected to the transverse ribs 263, 264, 265, and 266 for strengthening the structural strength of the base 2. The longitudinal ribs 262 are respectively connected to the transverse ribs 263 and 266. The ends of the longitudinal ribs 262 define the left and right boundaries of the guide channel 260.

The width of the guide channel 260 is substantially equal to the width of the locking portion 33, so as to guide the movement of the locking portion 33. Therefore, the locking portion 33 is always accurately inserted into the locking groove of the apparatus (not shown in figures).

In one embodiment, the method of use of the removable device 1 of the present disclosure is as follows.

When the removable device 1 is to be removed from the apparatus, the user can put his fingers into the first holding groove 316 and the second holding groove 27, and contact the first holding surface 317 and the second holding surface 270. Next, the user applies force against the positioning member 3 to compress the elastic structure 3 of the positioning member, so that the locking portion 33 moves from the released position (as shown in FIG. 3) toward the compressed position within the channel 25 (as shown in FIG. 4).

In the released position, the locking portion 33 of positioning member 3 extends out of the channel 25 via positioning opening 246, and the elastic structure 32 is released. The locking portion 33 is locked to the locking groove of the apparatus. In the compressed position, the locking portion 33 of the positioning member 3 returns into the channel 25, and the elastic structure 32 is compressed. The locking portion 33 is released from the locking groove of the apparatus.

As shown in FIG. 4, the movement of the positioning member 3 is limited by the cooperation of positioning structure 313 and block structure 253. When the positioning structure 313 abuts against the block structure 253, the user can grasp the first holding surface 317 and the second holding surface 270 with one hand, and firmly remove the removable device 1 from the apparatus. After the removal of the removable device 1, the positioning member 3 is released, and the positioning member 3 automatically returns to its original position through the elastic recovery force of the elastic structure 32. The return movement of the positioning member 3 is limited by the cooperation of the block structures 254 and 255 and the positioning structures 314 and 315. The user may instead apply force to the positioning member 3 only through the first holding groove 316 and the edge of the apparatus.

The removable device of the present disclosure is mounted to the apparatus by positioning member. Because the holding groove is provided on the positioning member, the aim of single-handed and quick release and installation of the removable device is achieved.

Many details often found in the art are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A removable device, comprising:

a base comprising a front surface, a first side surface, and a second side surface, wherein the front surface is between the first side surface and the second side surface, a positioning opening is on the first side surface, and the base has a channel, the channel extends along an imaginary transverse axis that passes the first side surface and the second side surface, and an end of the channel is in communication with the positioning opening;

a positioning member in the channel, and has a first holding groove, wherein the first holding groove is exposed from the front surface, and the positioning member is moveable between a released position and a compressed position in the channel along the imaginary transverse axis;

wherein in the released position, a locking portion of the positioning member extends outside the channel via the positioning opening, and in the compressed position, the locking portion is retracted into the channel, wherein the base further comprises a guide portion adjacent to the positioning opening, and the guide portion defines a guide channel, a first transverse rib, and a plurality of first longitudinal ribs for the locking portion to pass therethrough, wherein an end of the first transverse rib defines an upper boundary of the guide channel, an edge of the positioning opening defines a lower boundary of the guide channel, and ends of the first longitudinal ribs define a left and a right boundaries of the guide channel.

2. The removable device as claimed in claim 1, wherein the front surface comprises a second holding groove, and the second holding groove is between the channel and the second side surface.

3. The removable device as claimed in claim 2, wherein the first holding groove defines a first holding surface, and the second holding groove defines a second holding surface, and the first holding surface and the second holding surface face opposite directions.

4. The removable device as claimed in claim 1, further comprising a block structure in the channel, wherein the block structure is protruded from an inner surface of the channel to a center of the channel, and the positioning member has a positioning structure facing the block structure.

5. The removable device as claimed in claim 1, wherein the positioning member comprises a body, an elastic structure, and a locking portion, the body extends from a first end to a second end in the imaginary transverse axis, the locking portion is connected to the first end of the body, and the elastic structure is connected to the second end of the body and an end surface of the channel.

6. The removable device as claimed in claim 5, wherein the first holding groove is on the body.

7. The removable device as claimed in claim 5, wherein in the released position, the elastic structure is released, and in the compressed position, the elastic structure is compressed.

8. The removable device as claimed in claim 5, wherein the elastic structure comprises a compressing portion and two end portions, the compressing portion is a wave-shaped structure, and the end portions are connected to two opposite sides of the compressing portion respectively, and adjacent to the front surface.

9. The removable device as claimed in claim 5, wherein in the released position, the locking portion passes through the positioning opening.

10. The removable device as claimed in claim 9, wherein a width of the locking portion in a direction perpendicular to the imaginary transverse axis is less than the width of the body in the direction perpendicular to the imaginary transverse axis.

11. The removable device as claimed in claim 1, wherein the guide portion further comprises a second transverse rib and a second longitudinal rib, the first transverse rib and the second transverse rib are arranged on the positioning opening in a Z-axis direction, wherein a length of the second transverse rib is the same as a width of the positioning opening in a Y-axis direction, a length of the first transverse rib is less than the length of the second transverse rib, and the second longitudinal rib is connected to the first transverse rib and the second transverse rib.

* * * * *